(12) United States Patent
Suzuki et al.

(10) Patent No.: US 11,482,971 B2
(45) Date of Patent: Oct. 25, 2022

(54) ADJUSTING METHOD AND ADJUSTING SYSTEM FOR POWER AMPLIFIER

(71) Applicant: NIPPON TELEGRAPH AND TELEPHONE CORPORATION, Tokyo (JP)

(72) Inventors: Yoshinori Suzuki, Musashino (JP);
Kohei Suzaki, Musashino (JP);
Fumihiro Yamashita, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 137 days.

(21) Appl. No.: 16/976,484

(22) PCT Filed: Feb. 25, 2019

(86) PCT No.: PCT/JP2019/007039
§ 371 (c)(1),
(2) Date: Aug. 28, 2020

(87) PCT Pub. No.: WO2019/167878
PCT Pub. Date: Sep. 6, 2019

(65) Prior Publication Data
US 2021/0006210 A1 Jan. 7, 2021

(30) Foreign Application Priority Data
Mar. 2, 2018 (JP) .............................. JP2018-037425

(51) Int. Cl.
*H03F 1/26* (2006.01)
*H03F 1/32* (2006.01)
*H03F 3/24* (2006.01)

(52) U.S. Cl.
CPC ................. *H03F 1/32* (2013.01); *H03F 3/24* (2013.01); *H03F 1/3241* (2013.01); *H03F 1/3247* (2013.01)

(58) Field of Classification Search
CPC ........ H03F 1/32; H03F 3/24; H03F 2200/321; H03F 2200/451; H03F 3/189;
(Continued)

(56) References Cited

U.S. PATENT DOCUMENTS 7,348,844 B2 * 3/2008 Jaenecke ............... H04L 27/368
330/149
8,934,854 B2 * 1/2015 McCallister ............ H03F 3/245
455/127.1

FOREIGN PATENT DOCUMENTS

| JP | 2000049745 A | 2/2000 |
|----|--------------|--------|
| JP | 2011176751 A | 9/2011 |

OTHER PUBLICATIONS

Shoichi Narahashi, Yoshiaki Tarusawa, "Power amplifier linearization technology." Institute of Electronics, Information and Communication Engineers. Nov. 9, 2010. 4 groups-1 volume-10 chapters. Ver. Jan. 2020 11.9. <http://www.ieice-hbkb.org/portal/doc_510. html>. Machine translation attached.

* cited by examiner

*Primary Examiner* — Khanh V Nguyen

(57) ABSTRACT

An object is to provide a method and a system of adjusting a power amplifier which makes it possible to adjust a linearizer using signals of two carriers by the same power, to reduce the influence of the non-linearity on a multicarrier signal compared with the conventional. A method of adjusting a power amplifier, the power amplifier including a linearizer to reduce an intermodulation caused by non-linearity of the power amplifier, includes: inputting two signals generated by a signal generator into the power (Continued)

amplifier; measuring power of each order of first intermodulations of the two signals output from the power amplifier; calculating a power sum of second intermodulations by the plurality of signals using the measured power of each order of the first intermodulations; and adjusting the linearizer so that the power sum of the second intermodulations by the plurality of signals takes a minimum value or at most a predetermined value.

6 Claims, 5 Drawing Sheets

(58) Field of Classification Search
CPC .... H03F 1/3247; H03F 1/3241; H03F 1/3229; H03F 1/26; H03F 1/30; H03F 1/3223; G01R 23/20; H04B 1/04
USPC .......................................................... 330/149
See application file for complete search history.

ADJUSTING METHOD AND ADJUSTING SYSTEM FOR POWER AMPLIFIER

CROSS-REFERENCE TO RELATED APPLICATIONS

This application is a 371 U.S. National Phase of International Application No. PCT/JP2019/007039, filed on Feb. 25, 2019, which claims priority to Japanese Application No. 2018-037425, filed on Mar. 2, 2018. The entire disclosures of the above applications are incorporated herein by reference.

TECHNICAL FIELD

The present invention relates to a method and a system of adjusting a power amplifier having a linearizer.

BACKGROUND ART

Satellite communications can cover a wide service area, and have an advantage in disasters, which are features thereof. Satellite communications are therefor widely used for constructing communications environments on the ocean, in areas where a digital divide occurs, in disasters, and so on where and when landlines are difficult to use. Satellite communications, which are relayed by communications satellites in stationary orbits at an altitude of 36,000 km, however lead to very large propagation losses, which requires improved communication performance of base stations. Particularly, base stations aggregating data from communication terminals of respective dispersing users, such as VSAT (Very Small Aperture Terminal), handle a large channel capacity, and thus large transmit power is demanded.

In a base station, intermodulation (IM) occurs due to the influence of non-linearity of a power amplifier when a plurality of signals including data are amplified using the one power amplifier to make the transmit power large.

Examples of the method of making the influence of the non-linearity small include reducing the output of the power amplifier, that is, making the power amplifier back off to operate the power amplifier in the linear region. However, when the back-off for suppressing the influence of the non-linearity within an allowable range is, for example, 6 dB, necessary saturation power of the power amplifier of a base station is four times as large as the operation power (6 dB). This increase in the operation power of the power amplifier causes increase in power consumption and in costs such as development costs and product costs.

Proposed is the technique of a power amplifier having a linearizer to reduce the influence of the non-linearity (linearization) to satisfy a predetermined distortion property by a smaller back-off (see NPL 1). One method of reducing the non-linearity is a feedforward of cancelling intermodulation using a distortion detection circuit to detect intermodulation of a main amplifier to be compensated, and a distortion cancellation circuit to inject the detected intermodulation after amplified in an auxiliary amplifier into the output of the main amplifier so as to have the same amplitude and antiphase. Another method of reducing the non-linearity is predistortion of arranging a predistorter having inverse properties of the power amplifier before the power amplifier, to cancel intermodulation.

CITATION LIST

Non Patent Literature

[NPL 1] "*Denryoku Zoufukuki No Senkeika Gijutsu*" (Technique of Linearization for Power Amplifier), Knowledge base, The Institute of Electronics, Information and Communication Engineers, Group 4 Volume 1 Chapter 10-4, November 2010 Attorney Docket No.: 18W42-000020-US-NP (http://www.ieice-hbkb.org/portal/)

SUMMARY OF THE INVENTION

Technical Problem

Conventionally, two unmodulated carriers by the same power are input to a linearizer, to adjust the linearizer so as to lead to at most a predetermined level of the power sum of all the odd-order intermodulations except the first order, or at most a predetermined level of power of each of third-order intermodulation (IM3), fifth-order intermodulation (IM5), etc. For example, in the case of a feedforward, losses and the amounts of phase in a distortion detection circuit and a distortion cancellation circuit, and the amplification factor of an auxiliary amplifier are adjusted, to adjust a linearizer.

Power amplifiers used for satellite communications however amplify multicarrier signals of 10 carriers, 15 carriers, and so on. It is thus unknown whether adjustment of a linearizer using two carriers by the same power leads to optimal adjustment of the linearizer for multicarrier signals.

It is thus necessary to use a signal generator to generate multicarrier signals to be used in operation in order to have an optimally adjusted linearizer in shipping and the like. Multicarrier signal generators are however more expensive than signal generators to generate two carriers by the same power. Setting of a multicarrier signal generator causes a lot of work, and costs a lot etc.; and broader bands of generated signals lead to more increased work and costs etc. for the setting, which is problematic. Different specifications of multicarrier signals to be input to a linearizer require a check on setting of a signal generator, which leads to increase of time for evaluating the influence of the non-linearity.

An object of the present invention is to provide a method and a system of adjusting a power amplifier which makes it possible to adjust a linearizer using signals of two carriers by the same power, to reduce the influence of the non-linearity on a multicarrier signal compared with the conventional.

Means for Solving the Problem

A first invention is a method of adjusting a power amplifier, the power amplifier including a linearizer to reduce an intermodulation caused by non-linearity of the power amplifier, the method including: inputting two signals generated by a signal generator into the power amplifier; measuring power of each order of first intermodulations of the two signals output from the power amplifier; calculating a power sum of second intermodulations by a plurality of signals using the measured power of each order of the first intermodulations; and adjusting the linearizer so that the power sum of the second intermodulations by the plurality of signals takes a minimum value or at most a predetermined value.

A second invention is, in the first invention, that in said adjusting, the linearizer is adjusted so that as an order of a first intermodulation among first intermodulations by pairs of signals in the plurality of signals is smaller, power of the first intermodulation is smaller.

A third invention is, in the first or second invention, that in said inputting, power of the two signals generated by the signal generator is adjusted according to the number of the plurality of signals to be amplified by the power amplifier.

A fourth invention is a system of adjusting a power amplifier, the power amplifier including a linearizer to reduce an intermodulation caused by non-linearity of the power amplifier, the system including: a signal generator to generate two signals; a measurement device to measure power of each order of first intermodulations of the two signals output from the power amplifier; a calculation unit to calculate a power sum of second intermodulations by a plurality of signals using the measured power of each order of the first intermodulations; and a controlling unit to adjust the linearizer so that the power sum of the second intermodulations by the plurality of signals takes a minimum value or at most a predetermined value.

A fifth invention is that, in the fourth invention, the controlling unit adjusts the linearizer so that as an order of a first intermodulation among first intermodulations by pairs of signals in the plurality of signals is smaller, power of the first intermodulation is smaller.

A sixth invention is that, in the fourth or fifth invention, the controlling unit adjusts power of the two signals generated by the signal generator according to the number of the plurality of signals to be amplified by the power amplifier.

Effects of the Invention

The present invention makes it possible to adjust a linearizer using signals of two carriers by the same power, to reduce the influence of the non-linearity on a multicarrier signal compared with the conventional.

DESCRIPTION OF EMBODIMENTS

Hereinafter the embodiments will be described using the drawings.

Figure 1:
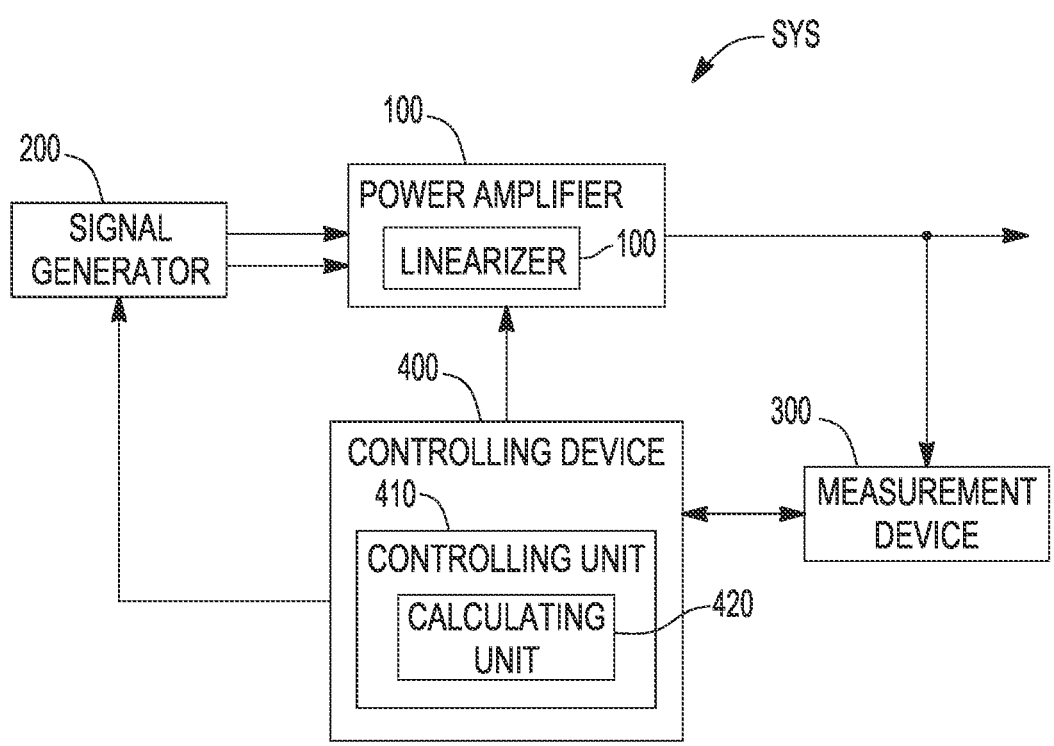
FIG. 1 shows one embodiment of an adjustment system.

FIG. 1 shows one embodiment of an adjustment system.

An adjustment system SYS shown in FIG. 1 has a signal generator 200, a measurement device 300, and a controlling device 400, for adjusting a power amplifier 100 including a linearizer 110.

For example, the power amplifier 100 is arranged in a base station for satellite communications, and a reducing process, by the linearizer 110, of reducing intermodulation caused by non-linearity of the power amplifier 100 is executed on a multicarrier signal to be transmitted by the base station. The power amplifier 100 amplifies the multicarrier signal after the reducing process by a preset amplification factor, to output the amplified multicarrier signal to a transmitter or the like included in the base station.

In contrast, in the power amplifier 100, signals of two carriers by the same power which are generated by the signal generator 200 are input, to execute a reducing process by the linearizer 110 on the two input signals when the operation of the linearizer 110 is adjusted. The power amplifier 100 amplifies the two input signals after the reducing process by a preset amplification factor, to output the amplified signals to the measurement device 300.

While amplifying the multicarrier signal for satellite communications, the power amplifier 100 may be applied to multicarrier signals for mobile communications etc. The linearizer 110 executes the reducing process by a feedforward, predistortion, etc. Intermodulation caused by the non-linearity of the power amplifier 100 will be described in FIGS. 2 and 3.

For example, the signal generator 200 generates the signals of unmodulated two carriers by the same power based on control commands from the controlling device 400, to output the generated signals to the power amplifier 100. The signals of two carriers by the same power generated by the signal generator 200 preferably have a frequency in a frequency band where the multicarrier signal amplified by the power amplifier 100 is.

The measurement device 300 is a spectrum analyzer or the like. The measurement device 300 monitors the signals output from the power amplifier 100 when the linearizer 110 is adjusted, based on control commands from the controlling device 400, to measure the power of each order intermodulation included in the monitored signals. The measurement device 300 outputs data including the measured power of each order intermodulation to the controlling device 400.

The controlling device 400 is a computing device including a controlling unit 410 such as a processor, and a memory device such as a hard disk device. The controlling unit 410 executes programs stored in the memory device of the controlling device 400, which leads to the controlling device 400 controlling the power amplifier 100, the signal generator 200, and the measurement device 300. The controlling unit 410 executes programs, to operate as a calculating unit 420.

The calculating unit 420 calculates the power sum of the intermodulations in the multicarrier signal by frequency, using the power of each order intermodulation by the signals of two carriers by the same power measured by the measurement device 300. The controlling unit 410 adjusts parameters such as a loss and the amount of phase in the linearizer 110, an amplification factor, etc. so that the power sum of the intermodulations calculated by the calculating unit 420 takes the minimum or at most a predetermined value. The operations of the controlling unit 410 and the calculating unit 420 will be described in FIGS. 2 to 4.

Figure 2:
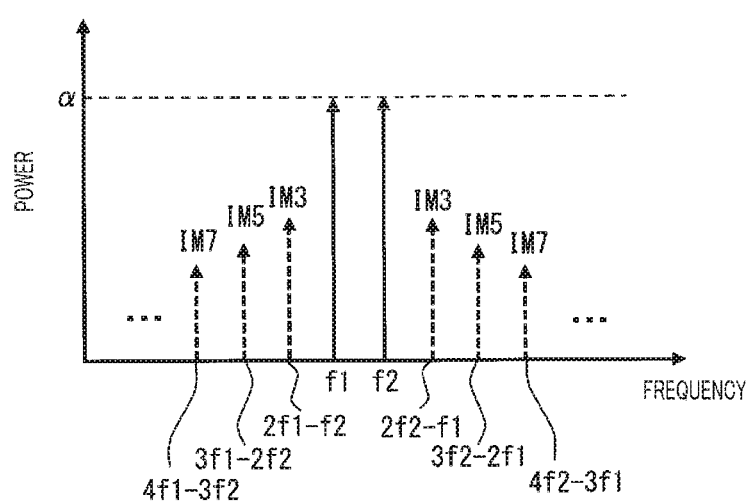
FIG. 2 is a graph showing one example of the output results when a power amplifier shown in FIG. 1 amplifies signals of two carriers by the same power which are received from a signal generator.

FIG. 2 shows one example of the output results when the power amplifier 100 shown in FIG. 1 amplifies the signals of two carriers by the same power which the power amplifier 100 receives from the signal generator 200. In FIG. 2, the vertical axis represents power and the horizontal axis represents frequency. In FIG. 2, the solid arrows represent respective signals of two carriers by the same power which are generated by the signal generator 200 (for example, frequency f1, f2 and power α). In FIG. 2, the dotted arrows represent signals of intermodulations. The frequency fIMk of each intermodulationis related to the frequencies f1, f2 of the signals of two carriers by the same power as the formula (1):

$$fIMk = |m \times f1 - n \times f2| \tag{1}$$

where m and n are natural numbers, and m+n (=k) represents an order of intermodulation. That is, 2f1−f2 represents the frequency fIM3 of the third-order intermodulation (IM3) on the low frequency side, 3f1-2f2 represents the frequency fIM5 of the fifth-order intermodulation (IM5) on the low frequency side, and 4f1-3f2 represents the frequency fIM7 of the seventh-order intermodulation (IM7) on the low frequency side. Further, 2f2-f1 represents the frequency fIM3 of the third-order intermodulation on the high frequency side, 3f2-2f1 represents the frequency fIM5 of the fifth-order intermodulation on the high frequency side, and 4f2-3f1 represents the frequency fIM7 of the seventh-order intermodulation on the high frequency side.

The power PIMk of the k-th order intermodulation is related as the formula (2):

$$PIMk \; Pk \times (P1^m P2^n)^{1/2} \quad (2)$$

where P1 and P2 each represent the power of the signals of two carriers by the same power at the frequencies f1, f2, which is the power; and Pk represents the power of the signals of two carriers by the same power at the frequencies f1, f2, and a conversion factor to the order k and intermodulation.

Figure 3:
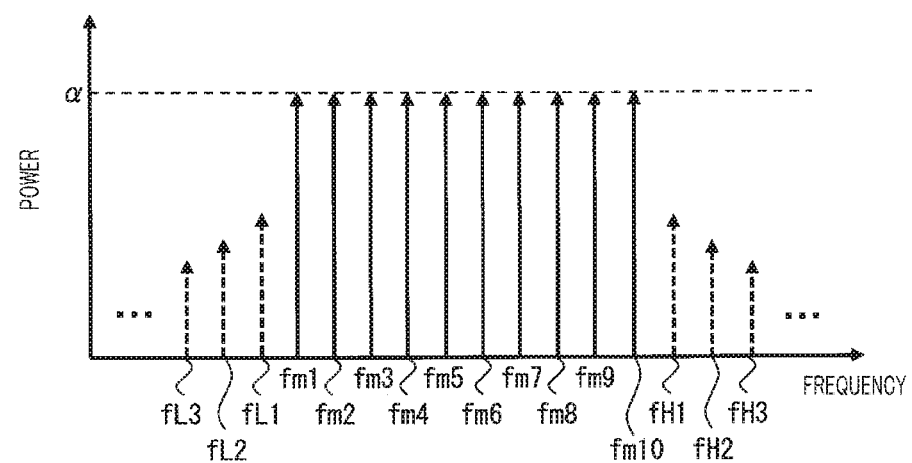
FIG. 3 is a graph showing one example of the output results when the power amplifier shown in FIG. 1 amplifies a multicarrier signal of 10 carriers.

FIG. 3 shows one example of the output results when the power amplifier 100 shown in FIG. 1 amplifies a multicarrier signal of 10 carriers. In FIG. 3, the vertical axis represents power and the horizontal axis represents frequency. In FIG. 3, the solid arrows each represent the multicarrier signal (for example, frequencies fm1-fm10 and power). In FIG. 3, the dotted arrows represent the signals of the intermodulations generated at the frequencies fLi and fHi (i is a positive integer) by the multicarrier signal. The multicarrier signal distributes at the frequencies fm1-fm10 at regular frequency intervals, and has a signal format in the same modulation by the same power. In this case, the frequency interval among the frequencies fLi and fHi is equal to that of the multicarrier signal.

For example, two signals at the frequencies fm1 and fm2 among the multicarrier signal shown in FIG. 3 generate the third-order intermodulation at the frequency fL1 on the low frequency side if being the signals of two carriers by the same power shown in FIG. 2. The multicarrier signal distributes at the frequencies fm1-fm10 at regular frequency intervals, which causes generation of the third-order intermodulation by pairs of the signals at the frequencies fm2 and fm4, the frequencies fm3 and fm6, the frequencies fm4 and fm8, and the frequencies fm5 and fm10 at the frequency fL1 on the low frequency side. The fifth-order intermodulation by pairs of the signals at the frequencies fm2 and fm3, the frequencies fm4 and fm6, and the frequencies fm6 and fm9 is also generated at the frequency fL1 on the low frequency side. Further, the seventh-order intermodulation by pairs of the signals at the frequencies fm3 and fm4, and the frequencies fm6 and fm8 is generated at the frequency fL1 on the low frequency side. That is, the power of the intermodulations by 10 pairs of the signals is superimposed at the frequency fL1 on the low frequency side.

In FIG. 3, for example, intermodulation by the third-order intermodulation generated at the frequency fm2 by the two signals at the frequencies fm3 and fm4, and the signal at the frequency fm1; that is, intermodulation by each of the k-th order intermodulations generated at frequencies fm1-fm10, and each signal at the frequencies fm1-fm10 is ignored because being converted twice as shown in the formula (2) and the conversion factor Pk in the formula (2) is smaller than −20 dB.

TABLE 1

|     | fL1 | fL2 | fL3 | fL4 | fL5 | fL6 |
|-----|-----|-----|-----|-----|-----|-----|
| IM3 | 5   | 4   | 3   | 3   | 3   | 2   |
| IM5 | 3   | 3   | 3   | 3   | 3   | 3   |
| IM7 | 2   | 2   | 3   | 2   | 2   | 2   |
| total | 10 | 9   | 9   | 8   | 8   | 7   |

Table 1 shows the number of pairs of signals to generate respective third-order, fifth-order, and seventh-order intermodulations (IM3, IM5 and IM7) superimposed at the frequencies fLi on the low frequency side when the number of carriers is 10. As shown in Table 1, larger k more reduces the number of pairs, that is, the number of the intermodulation components. While Table 1 shows the number of pairs at the frequencies fLi on the low frequency side, the same is applied to the frequencies fHi on the high frequency side.

TABLE 2

|     | fL1 | fL2 | fL3 | fL4 | fL5 | fL6 |
|-----|-----|-----|-----|-----|-----|-----|
| IM3 | 7   | 7   | 6   | 6   | 5   | 5   |
| IM5 | 5   | 5   | 4   | 5   | 4   | 4   |
| IM7 | 3   | 4   | 4   | 3   | 3   | 3   |
| total | 15 | 16  | 14  | 14  | 12  | 12  |

Table 2 shows the number of pairs of signals to generate the third-order, fifth-order or seventh-order intermodulation (IM3, IM5 or IM7) superimposed at the frequencies fLi on the low frequency side when the number of carriers is 15. Table 2 shows, in the same manner as in Table 1, that larger k more reduces the number of pairs, that is, the number of the intermodulation components. While Table 2 shows the number of pairs at the frequencies fLi on the low frequency side, the same is applied to the frequencies fHi on the high frequency side.

Figure 4:
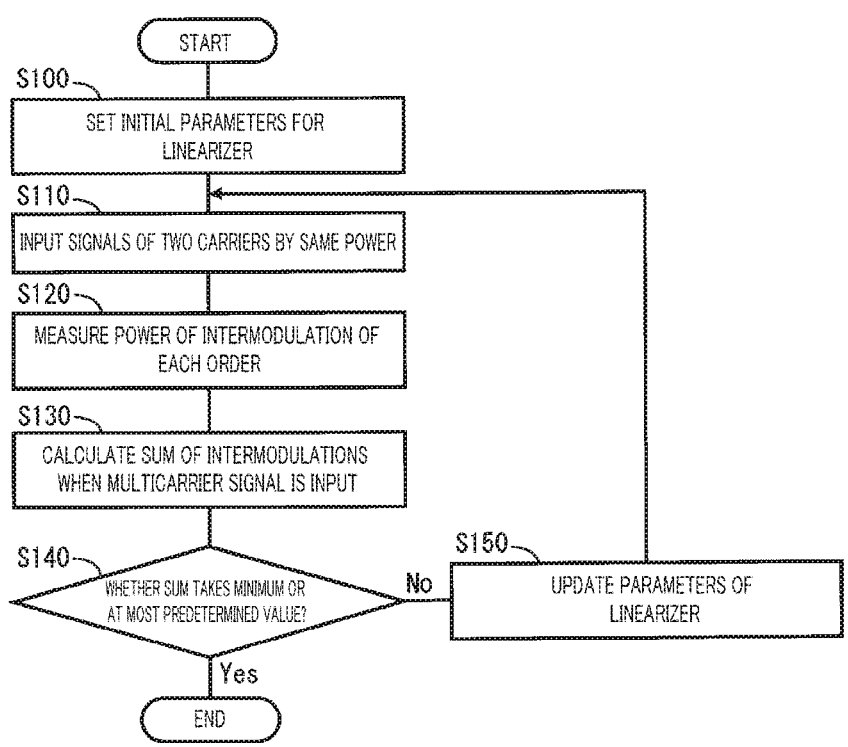
FIG. 4 shows one example of an adjustment process in the adjustment system shown in FIG. 1.

FIG. 4 shows one example of an adjustment process in the adjustment system SYS shown in FIG. 1. The process shown in FIG. 4 is realized by the controlling unit 410 to execute programs stored in the memory device of the controlling device 400. That is, the process shown in FIG. 4 is one embodiment of the method of adjusting the power amplifier.

In step S100, the controlling unit 410 sets values of parameters such as the initial loss and amount of phase, or amplification factor etc. which are prestored in the memory device of the controlling device 400 for the linearizer 110. In some cases, all the parameters of the linearizer 110 such as a loss and the amount of phase, or an amplification factor, etc., can be adjusted by the power amplifier 100, and in other cases, for example, only a loss and the amount of phase can be adjusted thereby. The controlling unit 410 therefore sets the initial values of adjustable parameters among the parameters stored in the memory device for the linearizer 110.

In step S110, the controlling unit 410 allows the signal generator 200 to generate the signals of unmodulated two carriers by the same power. The controlling unit 410 allows the signal generator 200 to input the signals of two carriers by the same power generated by the signal generator 200 to the power amplifier 100. The power amplifier 100 amplifies the input signals of two carriers by the same power, to output the amplified signals to the measurement device 300.

The frequency interval of the signal generator 200 may be set at 1 MHz or the like if the signal generator 200 is a commercially available product or the like. The frequency interval thereof may be an interval among adjacent carriers of the input signals. The signals of two carriers by the same power generated by the signal generator 200 may be a pair of signals at the frequencies fm1 and fm2 among the multicarrier signal.

In step S120, the measurement device 300 measures the power of each k-th order intermodulation included in the signals amplified in step S110. The measurement device 300 outputs data including the measured power of each k-th order intermodulation to the controlling device 400.

In step S130, the calculating unit 420 calculates the power of the intermodulations at the frequencies fLi and fHi by the multicarrier signal shown in FIG. 3, using the power of each k-th order intermodulation by the signals of two carriers by the same power measured in step S120. As shown in FIG. 3 and Table 1, for example, the third-order intermodulation by five pairs of the signals at the frequencies fm1 and fm2, the frequencies fm2 and fm4, the frequencies fm3 and fm6, the frequencies fm4 and fm8, and the frequencies fm5 and fm10 is generated at the frequency fL1 on the low frequency side. The fifth-order intermodulation by three pairs of the signals of the frequencies fm2 and fm3, the frequencies fm4 and fm6, and the frequencies fm6 and fm9 is also generated at the frequency fL1 on the low frequency side. The seventh-order intermodulation by two pairs of the signals of the frequencies fm3 and fm4, and the frequencies fm6 and fm8 is also generated at the frequency fL1 on the low frequency side.

For example, the calculating unit 420 multiplies the power of the third-order intermodulation at the frequency fIM3 on the low frequency side, which is measured in step S120, by a factor according to the power of each signal at the frequencies fm1 and fm2, to calculate the power of the third-order intermodulation at the frequency fL1 by the two signals at the frequencies fm1 and fm2. Likewise, the calculating unit 420 calculates the power of each of the third-order, fifth-order, or seventh-order intermodulation at the frequency fL1 on the low frequency side by another pair such as the two signals at the frequencies fm2 and fm4. The calculating unit 420 then adds the calculated power of the third-order, fifth-order, and seventh-order intermodulations by all the pairs of the signals, to calculate the power of the intermodulation at the frequency fL1 on the low frequency side.

The calculating unit 420 also calculates the power of each of the third-order, fifth-order, and seventh-order intermodulations by 10 pairs of the signals at the frequency fL2 on the low frequency side shown in Table 1 in the same manner as at the frequency fL1 on the low frequency side. The calculating unit 420 then adds the calculated power of the third-order, fifth-order, and seventh-order intermodulations by all the pairs of the signals, to obtain the power of the intermodulation at the frequency fL2 on the low frequency side. The calculating unit 420 also calculates the power of each of the third-order, fifth-order, and seventh-order intermodulations by every 9 pair of the signals at the frequency fL3 on the low frequency side. The calculating unit 420 adds the calculated power of the third-order, fifth-order, and seventh-order intermodulations by all the pairs of the signals, to obtain the power of the intermodulation at the frequency fL3 on the low frequency side.

The calculating unit 420 calculates the power of the intermodulations at the frequencies fH1, fH2 and fH3 on the high frequency side in the same manner as on the low frequency side, using the power of each k-th order intermodulation by two carriers by the same power measured in step S120.

The calculating unit 420 then adds the calculated power of the intermodulations at the frequencies fL1-fL3 and fH1-fH3, to calculate the power sum of the intermodulations in the multicarrier signal. This makes it possible for the calculating unit 420 to input all the pairs of the signals to the power amplifier 100 using the signal generator 200, to calculate the power sum of the intermodulations without measurement of the power of the all-order intermodulations.

While having the same power, the multicarrier signal may have different power at the frequencies fm1-fm10. In this case, the calculating unit 420 preferably calculates the power of each k-th order intermodulation according to the order k of the intermodulation and the power of the signal of each carrier.

In step S140, the controlling unit 410 determines whether the power sum of the intermodulations calculated in step S130 takes the minimum or at most a predetermined value. If the power sum of the intermodulations takes the minimum or at most a predetermined value, the adjustment system SYS ends the adjustment process. In contrast, if the power sum of the intermodulations does not take the minimum, or if the power sum thereof takes more than a predetermined value, the process of the adjustment system SYS moves to step S150, an adjustment step.

The foregoing predetermined value is preferably determined suitably based on the communication quality etc. required of satellite communications.

In step S150, the controlling unit 410 updates the parameters of the linearizer 110 such as a loss and the amount of phase, or an amplification factor etc. based on an optimization process such as gradient descent so that the power sum of the intermodulations calculated in step S130 takes the minimum or at most a predetermined value, and sets the updated parameters for the linearizer 110.

The adjustment system SYS then executes the process of steps S110 to S140 using the parameters updated in step S150.

In the embodiments shown in FIGS. 1 to 4, the controlling device 400 allows the signal generator 200 to generate the signals of unmodulated two carriers by the same power which correspond to two carriers in the multicarrier signal used for satellite communications, and to input the generated signals of two carriers by the same power to the power amplifier 100. The measurement device 300 measures the power of the k-th order intermodulations by the signals of two carriers by the same power amplified by the power amplifier 100. The controlling device 400 then calculates the power of each k-th order intermodulation by pairs of signals of two carriers in the multicarrier signal at each of the frequencies fLi and fHi, using the power of the k-th order intermodulation by the measured signals of unmodulated two carriers by the same power. This makes it possible for the controlling device 400 to calculate the power sum of the intermodulations by the multicarrier signal. The adjustment system SYS thus can optimally adjust the linearizer 110 compared with the conventional so as to reduce the influence of the non-linearity on the multicarrier signal, using the signals of unmodulated two carriers by the same power.

The controlling unit 410 preferably adjusts the power of the signals of two carriers by the same power generated by the signal generator 200 according to the number in the multicarrier signal amplified by the power amplifier 100. Concerning this, the power of the signals of two carriers by the same power used for adjusting the linearizer 110 varies according to time because of two sine waves at different frequencies. The peak to average power ratio (PAPR) is an index for evaluating this characteristic.

Figure 5:
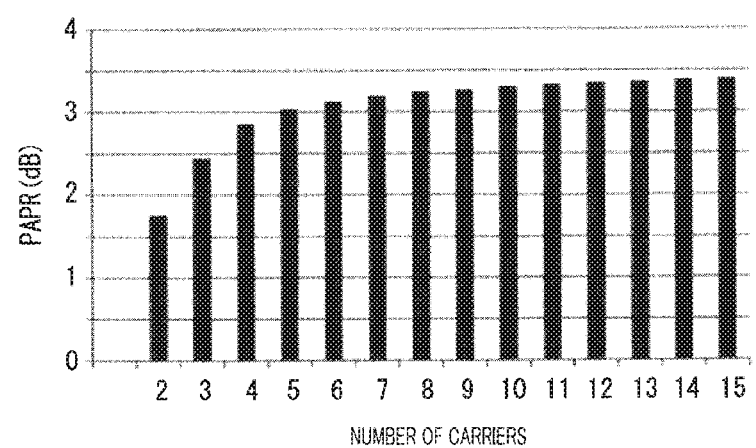
FIG. 5 is a graph showing one example of a difference between PAPR in the QPSK modulation by the number of carriers and PAPR of signals of two carriers by the same power.

FIG. 5 shows one example of a difference between PAPR (99% value) in the QPSK (Quadrature Phase Shift Keying) modulation by the number of carriers and PAPR (99% value) of the signals of two carriers by the same power. As shown in FIG. 5, the instantaneous value of the power varies according to the number of carriers, and larger PAPR than that of the signals of two carriers by the same power is shown. That is, it is shown that the multicarrier signal is instantaneously input to the power amplifier 100 by higher power than the signals of two carriers by the same power are. Thus, for example, when the multicarrier signal to be amplified by the power amplifier 100 includes at least 5 carriers when the adjustment system SYS adjusts the linearizer 110 using the signals of two carriers by the same power, the signals of two carriers by the same power generated by the signal generator 200 are preferably input to the power amplifier 100 by the power increased by approximately 3 dB.

The adjustment system SYS shown in FIG. 1 may adjust the linearizer 110 so that when the power sum of the intermodulations by the multicarrier signal meets a certain condition (for example, −25.2 dB, −30 dB each in the case of the equal level), the power of each of the third-order, fifth-order, and seventh-order intermodulations by every pair of the signals which are superimposed at each of the frequencies fL1-fL3 and fH1-fH3 is smaller as the order k is smaller.

TABLE 3

| pattern | 0 | 1 | 2 | 3 | 4 | 5 | 6 |
|---|---|---|---|---|---|---|---|
| IM3 (dB) | −30.0 | −27.7 | −27.7 | −30.7 | −30.7 | −33.7 | −33.7 |
| IM5 (dB) | −30.0 | −30.7 | −33.7 | −27.7 | −33.7 | −27.7 | −30.7 |
| IM7 (dB) | −30.0 | −33.7 | −30.7 | −33.7 | −27.7 | −30.7 | −27.7 |
| sum (dB) | | | | −25.2 | | | |
| amount of improvement (dB) | — | −0.67 | −0.47 | −0.24 | 0.52 | 0.26 | 0.82 |

Table 3 shows one example of the amount of improvement of the power sum of the intermodulations when the linearizer 110 is adjusted in every 6 pattern for the power of the third-order, fifth-order, and seventh-order intermodulations at the frequency fL1 on the low frequency side in, for example, a multicarrier signal having 15 carriers. While Table 3 shows the case at the frequency fL1 on the low frequency side, the same is applied at the other frequencies fLi and frequencies fHi.

"Pattern 0" shows the case where the power of the intermodulations by the multicarrier signal is −25.2 dB, and the power of each of the third-order, fifth-order, and seventh-order intermodulations is at the same level of −30.0 dB, that is, by the same power. "Pattern 1" to "pattern 6" show the case where the power sum of the intermodulations by the multicarrier signal is −25.2 dB, and the power of the third-order, fifth-order, and seventh-order intermodulations is respectively adjusted so as to be at any combination of, for example, −27.7 dB, −30.7 dB and −33.7 dB. "Pattern 1" shows the case where the power of the third-order, fifth-order, and seventh-order intermodulations is adjusted so that the adjustment amounts thereof are reduced by, for example, 3 dB as the order k is larger as the conventional.

The amount of improvement shows a difference of each pattern based on "pattern 0". That is, as shown in Table 3, when adjustment is carried out so that the adjustment amounts are reduced by 3 dB as the order k is larger as "pattern 1", which corresponds to the conventional, the amount of improvement becomes worse than "pattern 0" by −0.69 dB. In contrast, when the power of each of the third-order, fifth-order, and seventh-order intermodulations is adjusted so that the adjustment amounts are reduced as the order k is smaller as "pattern 6", the amount of improvement is 0.82 dB based on "pattern 0", which is the most improved. Concerning this, since smaller order k leads to a larger number of the intermodulations as shown in Tables 2 and 3, adjustment of the linearizer 110 by the adjustment system SYS such that the adjustment amount of the power of a smaller order intermodulation is reduced more as "pattern 6" can improve the power sum of the intermodulations in the multicarrier signal by approximately 1.5 dB more than the case of "pattern 1", which is the conventional.

The foregoing detailed description may make features and advantages of the embodiments clear. This intends that the claims cover features and advantages of the embodiments as the foregoing within the range without deviating from the spirit thereof and the claims themselves. The person having ordinary skill in the art should easily achieve any improvements and changes. Thus, there is no intention of limiting the scope of the patentable embodiments to the foregoing, and the claims may depend on appropriate improvements and equivalents within the scope disclosed in the embodiments.

REFERENCE SIGNS LIST

100 Power amplifier
110 Linearizer
200 Signal generator
300 Measurement device
400 Controlling device
410 Controlling unit
420 Calculating unit
SYS Adjustment system

The invention claimed is:

1. A method of adjusting a power amplifier, the power amplifier including a linearizer to reduce an intermodulation caused by non-linearity of the power amplifier, the method comprising: inputting two signals generated by a signal generator into the power amplifier; measuring power of each order of first intermodulations of two signal output from the power amplifier; calculating a power sum of second intermodulations by a plurality of signals using the measured power of each order of the first intermodulations; and adjusting the linearizer so that the power sum of the second intermodulations by the plurality of signals takes a minimum value or at most a predetermined value.

2. The method according to claim 1, wherein in said adjusting, the linearizer is adjusted so that as an order of a first intermodulation among first intermodulations by pairs of signals in the plurality of signals is smaller, power of the first intermodulation is smaller.

3. The method according to claim 1, wherein said inputting, power of the two signals generated by the signal generator is adjusted according to the number of the plurality of signals to be amplified by the power amplifier.

4. A system of adjusting a power amplifier, the power amplifier including a linearizer to reduce an intermodulation caused by non-linearity of the power amplifier, the system comprising: a signal generator to generate two signals; a measurement device to measure power of each order of first intermodulations of two signal output from the power amplifier; a calculation unit to calculate a power sum of second intermodulations by a plurality of signals using the measured power of each order of the first intermodulations; and a controlling unit to adjust the linearizer so that the power sum of the second intermodulations by the plurality of signals takes a minimum value or at most a predetermined value.

5. The system according to claim 4, wherein the controlling unit adjusts the linearizer so that as an order of a first intermodulation among first intermodulations by pairs of signals in the plurality of signals is smaller, power of the first intermodulation is smaller.

6. The system according to claim 4, wherein the controlling unit adjusts power of the two signals generated by the signal generator according to the number of the plurality of signals to be amplified by the power amplifier.

* * * * *